(12) United States Patent
Amagi et al.

(10) Patent No.: US 6,492,008 B1
(45) Date of Patent: Dec. 10, 2002

(54) MULTILAYER PRINTED WIRING BOARD AND ELECTRONIC EQUIPMENT

(75) Inventors: Shigeo Amagi, Tokai-mura (JP); Satoshi Murakawa, Hadano (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 09/686,931

(22) Filed: Oct. 12, 2000

(30) Foreign Application Priority Data

Oct. 13, 1999 (JP) .......................................... 11-291500

(51) Int. Cl.$^7$ ................................................ B32B 3/00
(52) U.S. Cl. ...................... 428/209; 428/901; 174/255
(58) Field of Search ................. 428/209, 901; 174/250, 255

(56) References Cited

U.S. PATENT DOCUMENTS

| | | | |
|---|---|---|---|
| 4,501,787 A | * 2/1985 | Marchetti et al. | ............ 428/236 |
| 4,747,897 A | * 5/1988 | Johnson | ...................... 156/148 |
| 4,798,762 A | * 1/1989 | Okada et al. | ................. 428/285 |
| 4,814,945 A | * 3/1989 | Leibowitz | ................... 174/68.5 |
| 4,882,454 A | * 11/1989 | Peterson et al. | ............ 174/68.5 |
| 4,963,697 A | * 10/1990 | Peterson et al. | ............. 174/252 |
| 5,103,293 A | * 4/1992 | Bonafino et al. | ............. 357/80 |
| 5,264,065 A | * 11/1993 | Kohm | ...................... 156/307.4 |
| 6,136,733 A | * 10/2000 | Blumberg et al. | ........... 442/247 |

FOREIGN PATENT DOCUMENTS

| | | | |
|---|---|---|---|
| JP | 2-177391 | * | 7/1990 |
| JP | 8-192482 | * | 7/1996 |
| JP | 8-250860 | * | 9/1996 |

* cited by examiner

*Primary Examiner*—Cathy Lam
(74) *Attorney, Agent, or Firm*—Antonelli, Terry, Stout & Kraus, LLP

(57) ABSTRACT

The thermal expansion coefficient of a composite insulator layer is adjusted in order to suppress warping deformation in a multilayer printed wiring board caused by temperature change. The thicknesses and the covering ratios on the both sides of the electric conductor layer composing the multilayer printed wiring board are asymmetric with respect to the central plane. A multilayer printed wiring board is formed by laminating composite insulation layers and laminated bodies, the composite insulation layer being made of a cloth a resin impregnated into the cloth, the laminated body being composed of electric conductor layers formed by coating on a surface of the composite insulation layer. The thermal expansion coefficient of the composite insulation layer having a conductor layer with a higher covering ratio is set to be smaller than the thermal expansion coefficient of the composite insulation layer having a conductor layer with a lower covering ratio.

8 Claims, 6 Drawing Sheets

COVERING RATIO Cu FILM ATTACHED ONTO BOTH SURFACES (Y-axis: THERMAL EXPANSION COEFFICIENT RATIO NECESSARY FOR KEEPING THERMAL EXPANSION COEFFICIENT OF LAMINATED LAYER TO THE SAME VALUE AS Cu COVERING RATIO 0.3)

MULTILAYER PRINTED WIRING BOARD AND ELECTRONIC EQUIPMENT

BACKGROUND OF THE INVENTION

The present invention relates to a multilayer printed wiring board and, more particularly to a multilayer printed wiring board suppressing warping caused by temperature change and an electronic equipment using the multilayer printed wiring board.

A printed wiring board is composed of a composite insulation material formed of fiber woven cloth impregnated with a resin and a circuit pattern of electric conductor formed on the surface of the composite insulation material, and a multilayer printed wiring board is formed by laminating the printed wiring boards in multilayer. E-glass fiber of electric use is generally used for the cloth used for the composite insulation material. Quartz glass fiber or aromatic polyamide fiber is sometimes used for the cloth. A copper film or a copper film having nickel plate on the surface is used for the electric conductor.

The thermal expansion coefficient of the copper film of the electric conductor material is approximately $17 \times 10^{-6}$ (1/°C.), and the thermal expansion coefficient of the composite insulation material made of E-glass fiber and an epoxy group resin is approximately $11 \times 10^{-6}$ (1/°C.). The thermal expansion coefficients of the electric conductor material and the composite insulation material are different from each other as described above. Therefore, the thermal expansion coefficient in the surface direction of the multilayer printed wiring board made of the electric conductor material and the composite insulation material depends on a thickness of the electric conductor forming the circuit pattern and a ratio of the circuit pattern formed of the electric conductor covering the surface of the composite insulation material, that is, a covering ratio.

In general, the circuit patterns formed in the multilayer printed wiring board are not symmetric with respect to the central plane in the thickness direction of the multilayer printed wiring board. In the case where the thicknesses and the covering ratios on the both sides of the electric conductor layers composing the multilayer printed wiring board are asymmetric with respect to the central plane as described above, the thermal expansion coefficients in the surface direction of the electric conductor layers become asymmetric.

Therefore, when the multilayer printed wiring board receives a thermal effect during manufacturing, a warp occurs in the board. If there is a warp in the multilayer printed wiring board, trouble occurs in connecting electronic parts when the electric parts are soldered on the surface of the multilayer printed wiring board because displacement occurs in positional relationship between a junction formed in the part and a junction formed in the multilayer printed wiring board.

In general, the multilayer printed wiring board is formed by that a plurality of printed wiring boards having a circuit pattern on the surface of the composite insulation material are bonded using prepreg by heating at about 170° C. Therein, in a case where the thicknesses and the covering ratios on the both sides of the electric conductor layers composing the formed multilayer printed wiring board are asymmetric with respect to the central plane as described above, a warping deformation occurs in the multilayer printed wiring board due to the difference of the thermal expansion coefficients when the multilayer printed wiring board is cooled down to room temperature (20° C.) after being heated and bonded at 170° C. When electronic parts are soldered on the multilayer printed wiring board, the multilayer printed wiring board is heated up to 170° C. or higher. In that time, a warping deformation also occurs in the multilayer printed wiring board due to the difference of the thermal expansion coefficients.

SUMMARY OF THE INVENTION

An object of the present invention is to provide a multilayer printed wiring board and an electronic circuit which are small in the warping deformation due to temperature change even if the thicknesses and the covering ratios on the both sides of the electric conductor layer are asymmetric with respect to the central plane. the present invention is characterized by a multilayer printed wiring board formed by laminating composite insulation layers and laminated bodies, the composite insulation layer being made of a cloth and a resin impregnated into the cloth, said laminated body being composed of electric conductor layers formed on a surface of the composite insulation layer, wherein a thermal expansion coefficient of the composite insulation layer having a higher covering ratio by the electric conductor layer is set to a value smaller than a thermal expansion coefficient of the composite insulation layer having a lower covering ratio by the electric conductor layer.

Further, a multilayer printed wiring board in accordance with the present invention is characterized by that a thermal expansion coefficient of the cloth in the composite insulation layer having a higher covering ratio by the electric conductor layer is a value larger than a thermal expansion coefficient of said the in the composite insulation layer having a lower covering ratio by the electric conductor layer.

Further, a multilayer printed wiring board in accordance with the present invention is characterized by that the electric conductor layer comprises an electric power supply layer and a signal layer, and a thermal expansion coefficient of at least one of the composite insulator layers in contact with the electric power supply layer is set to a value smaller than a thermal expansion coefficient of the composite insulator layer in contact with the signal layer.

Further, a multilayer printed wiring board in accordance with the present invention is characterized by that the electric conductor layer comprises an electric power supply layer having a covering ratio of 60 to 80%, preferably 65 to 75% and a signal layer having a covering ratio of 10 to 20%, and a thermal expansion coefficient of at least one of the composite insulator layers in contact with the electric power supply layer is within a range of 8.5 to $9.5 \times 10^{-6}$/°C., and a thermal expansion coefficient of the composite insulator layer in contact with the signal layer is within a range of 10 to $12 \times 10^{-6}$/°C., preferably 10.5 to $11.5 \times 10^{-6}$/°C.

Further, a multilayer printed wiring board in accordance with the present invention is characterized by that the electric conductor layer comprises an electric power supply layer and a signal layer, and the cloth of at least one of the composite insulator layers in contact with the electric power supply layer is made of quartz glass, and the cloth of the composite insulator layer in contact with the signal layer is made of a glass having a thermal expansion coefficient larger than a thermal expansion coefficient of the quartz glass.

As the circuit layers in accordance with the present invention, 4 to 50 layers can be formed.

Further, the present invention is characterized by an electronic equipment comprising electronic parts mounted on a circuit connecting pad formed on a surface of the multilayer printed wiring board described above.

Particularly, in the present invention, a highly productive wiring board can be obtained by that the composite insulator layer is formed by using the same amount of cloth contained in each composite insulator layer and using a material having different thermal expansion coefficient for the cloth. Therefore, it is preferable that quartz glass is used for the composite insulator layer having a larger covering ratio and a glass having a thermal expansion coefficient larger than a thermal expansion coefficient of the quartz glass is used for the composite insulator layer having a smaller covering ratio.

An example of a manufacturing method of the multilayer printed wiring board in accordance with the present invention is as follows.

A sheet of inner prepreg is obtained by impregnating and applying an impregnating epoxy vanish into and to a sheet-shaped base material and by drying it at temperature of room temperature to 170° C. Therein, setting of the drying temperature is determined depending on the solvent and the base material used. Circuit patterns are formed on a cured laminated board formed of the obtained prepreg and copper films, and then necessary number of the cured laminated boards having circuit patterns are laminated interposing prepreg sheet between the cured laminated boards, and the laminated cured laminated board is bonded under a condition of 100 to 250° C. and 1 to 100 kgf/cm$^2$ to obtain a multi printed wiring board.

In regard to the fiber cloth of the sheet-shaped base material, various kinds of glass fibers such as E-glass fiber, C-glass fiber, A-glass fiber, S-glass fiber, D-glass fiber, YM-31-A glass fiber made from $SiO_2$, $Al_2O_3$, and quartz glass fiber can be used as an inorganic fiber. Alamide fiber made from a polymer having an aromatic polyamideimide skeleton can be used as an organic fiber. It is preferable that the fiber cloth is contained 20 to 40 volumetric % to the insulator layer and has a diameter of 10 to 20 μm.

It is preferable that one layer of the insulator layer is composed of a plurality of the fiber cloth layers, and the insulator layers are laminated alternatively in a thinner layer and a thicker layer through the circuit conductor layer, and line width of a signal layer and a matching layer is smaller than 100 μm.

It is preferable that thickness of the insulator layer is smaller than 250 μm, and number of the fiber cloth layers per one layer of the insulator layer is 2 to 5. Particularly, it is preferable that one layer of the thinner insulator layer is composed of 2 layers of the fiber cloth layers and has a thickness smaller than 100 μm and one layer of the thicker insulator layer is composed of 3 layers of the fiber cloth layers and has a thickness smaller than 150 μm.

In the present invention, in a computer connecting structure in which pins provided in a ceramic multilayer wiring board mounting a plurality of semiconductor elements are inserted into and fixed to through holes provided in a multilayer printed wiring board, and terminals of the multilayer printed wiring board are electrically connected to a multi-conductor connector provided in a back board, at least one of the multilayer printed wiring board and the back board is formed of the above-mentioned board alternatively laminated the insulator layer the fiber cloth impregnated with a resin and the circuit conductor layer, and the insulator layer has a specific dielectric constant in 1 MHz of 3.0 to 3.5, a flame retardancy in UL94 of V-0 and a thermal expansion coefficient of $5.0 \times 10^{-5}$ to $8.0 \times 10^{-5}$/°C., and a line width of the circuit signal layer is smaller than 100 μm.

In addition to the above, the multilayer printed wiring board in accordance with the present invention can be used for a printed board of an electronic unit of a cellular phone, personal computer or a ECU of a vehicle.

DESCRIPTION OF THE PREFERRED EMBODIMENTS

Figure 1:
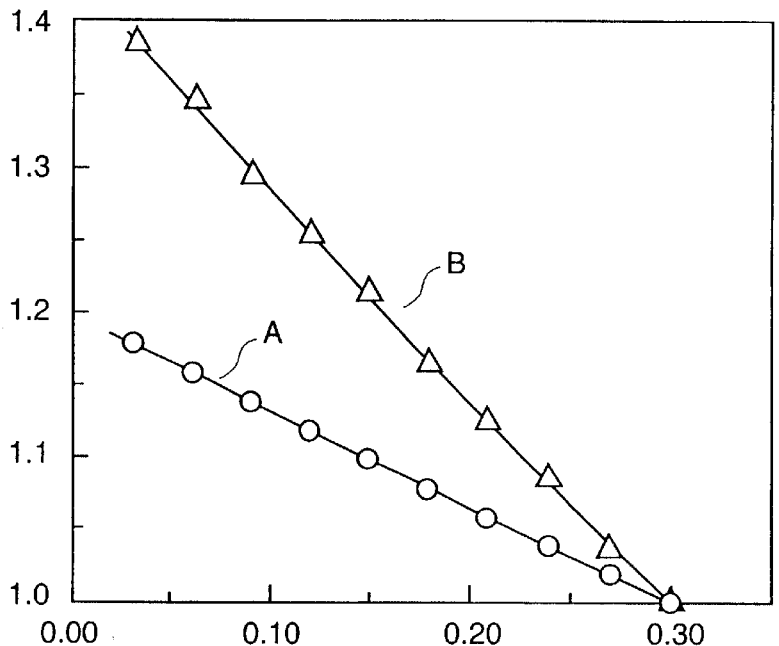
FIG. 1 is a diagram showing the changing rate of thermal expansion coefficient of an insulation material which is necessary for obtaining the same thermal expansion coefficient when the covering ratio of an electric conductive layer.

When the covering ratio of electric conductive layers in a printed wiring board having the electric conductive layers on the both surfaces of an insulator layer is changed, the changing rate of thermal expansion coefficient of the insulator layer necessary for obtaining the same thermal expansion coefficient before changing the covering ratio is shown in FIG. 1. In FIG. 1, the curve A shows a case where glass cloth impregnated with a resin is used for the composite insulator layer, and the curve B shows a case where only a resin is used.

Table 1 shows coefficients of longitudinal elasticity, thermal expansion coefficients and values of layer thickness in the case where only a resin is used for the composite insulator layer and in the case where glass cloth impregnated with a resin is used. In Table 1, E1, E2 indicate the coefficients of longitudinal elasticity of the electric conductor layer and the insulator layer, respectively, and α1, α2 indicate the thermal expansion coefficients of the electric conductor layer and the insulator layer, respectively, and t1, t2 indicate the values of layer thickness of the electric conductor layer and the insulator layer, respectively.

TABLE 1

| | elasticity (GPa) | | thermal expansion ($10^{-6}/°$ C.) | | thickness (mm) | |
|---|---|---|---|---|---|---|
| | E1 | E2 | α1 | α2 | t1 | t2 |
| Resin | 110 | 3 | 17 | 11 | 0.011 | 0.100 |
| Composite | 110 | 20 | 17 | 11 | 0.11 | 0/100 |

As shown in FIG. 1 and Table 1, in order to maintain the thermal expansion coefficient of the printed wiring board when the covering ratio of copper film is changed, the thermal expansion coefficient of the insulator layer (the resin material) must be largely changed in the case where an insulator layer having a lower coefficient of elasticity is used for the insulator layer (the resin indicated by the curve B in FIG. 1) compared to the case where an insulator layer having a higher coefficient of elasticity is used for the insulator layer (the glass cloth impregnated with the resin indicated by the curve A in FIG. 1).

In other words, in the case where the thicknesses and the covering ratios on the both surfaces of the electric conductor layers composing the multilayer printed wiring board are asymmetric with respect to the central plane of the electric conductor layers, the warping deformation of the multilayer printed wiring board is difficult to be suppressed by the thermal expansion coefficient of the insulator layer when an insulator layer having a low coefficient of elasticity is used as the insulator layer. On the other hand, the warping deformation of the multilayer printed wiring board is relatively easy to be suppressed by the thermal expansion coefficient of the insulator layer when an insulator layer having a high coefficient of elasticity (the glass cloth impregnated with the resin) is used as the insulator layer.

Therefore, a multilayer printed wiring board was fabricated. The multilayer printed wiring board was fabricated so that in a multilayer printed wiring board which was warped by temperature change, an insulator layer having a larger thermal expansion coefficient was arranged in the side where the multilayer printed wiring board warps convexly when it is cooled, and an insulator layer having a thermal expansion coefficient smaller than the thermal expansion coefficient of the insulator layer in the convex side was arranged in the side where the multilayer printed wiring board warps concavely. In the multilayer printed wiring board, an amount of thermal contraction in the concave side when cooled can be made equal to an amount of thermal contraction in the concave side by using the composite insulator layer having the thermal expansion coefficient smaller than that of the composite insulator layer in the side where it is convexly warped. Thereby, the warping of the multilayer printed wiring board due to temperature change can be reduced. Accordingly, it is possible to suppress positional displacement between a junction formed in the part and a junction formed in the multilayer printed wiring board when the electric parts are soldered on the surface of the multilayer printed wiring board, and consequently no trouble occurs in connecting the electronic parts.

Embodiment 1

Figure 2:
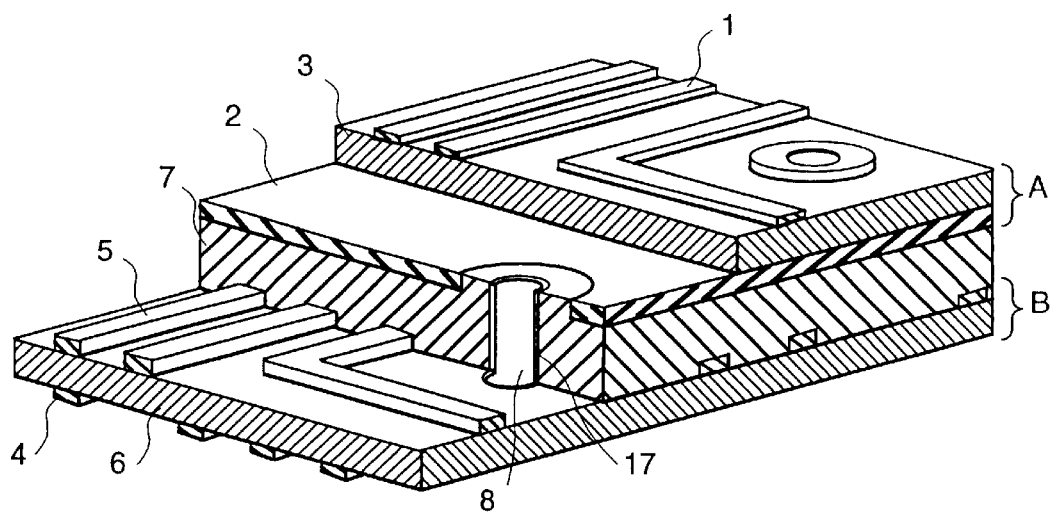
FIG. 2 is a schematic cross-sectional view showing a first embodiment of a multilayer printed wiring board.

FIG. 2 to FIG. 11 are drawings for explaining a first embodiment in accordance with the present invention. FIG. 2 is a schematic cross-sectional view showing the first embodiment of the multilayer printed wiring board. Referring to FIG. 1, the reference character 1 is a first signal wiring conductor made of copper, the reference character 2 is an electric power supply wiring conductor made of copper, and the reference character 3 is a first composite insulator layer which is composed of cloth of 60 weight % made of quartz glass and an epoxy group resin impregnated into the cloth, and has a thickness of approximately 0.12 mm. The first signal wiring conductor 1 and the electric power supply wiring conductor 2 are formed respectively on the both surfaces of the composite insulator layer 3 to form an upper part body A.

The reference character 4 is a second signal wiring conductor, and the reference character 5 is a third signal wiring conductor made of copper. The reference character 6 is a second composite insulator layer which is composed of cloth of 60 weight % made of E-glass and an epoxy group resin impregnated into the cloth, and has a thickness of approximately 0.12 mm. The second signal wiring conductor and the third signal wiring conductor are formed respectively on the both surfaces of the composite insulator layer 6 to form a lower part body B.

The reference character 7 is a third composite insulator layer which is composed of cloth of 60 weight % made of E-glass and an epoxy group resin impregnated into the cloth, and has a thickness of approximately 0.14 mm. The upper part body A and the lower part body B are bonded through the third composite insulator layer 7 tp form the multilayer printed wiring board. Further, the reference character 8 is a through hole, and the reference character 17 is a copper plated film formed inside the through hole.

The first signal wiring conductor 1 and the second signal wiring conductor 4 each have a covering ratio of about 15% and a thickness of about 0.048 mm. The third signal wiring conductor 5 has a covering ratio of about 14% and a thickness of about 0.035 mm. On the other hand, the electric power supply wiring conductor has a covering ratio of about 68% and a thickness of about 0.035 mm. That is, the amount of conductor contained in the upper part body A is more than the amount of conductor contained in the lower part body B.

The thermal expansion coefficient of the conductor material of copper is $17 \times 10^{-6}$ ($1/°$C.), and the thermal expansion coefficient of the composite insulator material composed of the E-glass fiber and the epoxy group resin is $11 \times 10^{-6}$ ($1/°$C.). Therefore, if all the insulator layers composing the multilayer printed wiring board are formed of the composite insulator material composed of the E-glass fiber and the epoxy group resin, the thermal expansion coefficient of the upper part body becomes larger than the thermal expansion coefficient of the lower part body. Accordingly, when the multilayer printed wiring board is cooled, the multilayer printed wiring board is warped so that the upper part body becomes concave because the upper part body is contracted more largely than the lower part body.

On the other hand, in the present embodiment, the cloth made of the quartz glass and the epoxy group resin impregnated into the cloth are used for the first composite insulator layer. The thermal expansion coefficient of the composite insulator material composed of the quartz glass fiber and the epoxy group resin impregnated into the cloth is $9 \times 10^{-6}$ ($1/°$C.). By constructing the first composite insulator layer using the insulator material having the mall thermal expansion coefficient as described above, the contraction amount of the upper part body becomes nearly equal to the contraction amount of the lower part body when the multilayer printed wiring board is cooled, and the amount of warping can be suppressed below 0.1 mm per 100 mm.

A method of fabricating the present embodiment of the multilayer printed wiring board in accordance with the present invention will be described blow, referring to FIG. 3 to FIG. 10. In these drawings, the reference character 10 is a copper film having a weight of ½ ounce per 1 m², the reference character 11 is a copper film having a weight of 1 ounce per 1 m², the reference character 12 is a copper plated laminated plate using the quartz cloth, the reference character 13 is a guide hole, the reference character 14 is a copper plated laminated plate using the E-glass cloth, the reference character 15 is a composite insulator layer, and the reference character 16 is a hole for a through hole. Like parts in each of the drawings are identified by the same reference characters in FIG. 1, and the explanation will be omitted.

Figure 3:
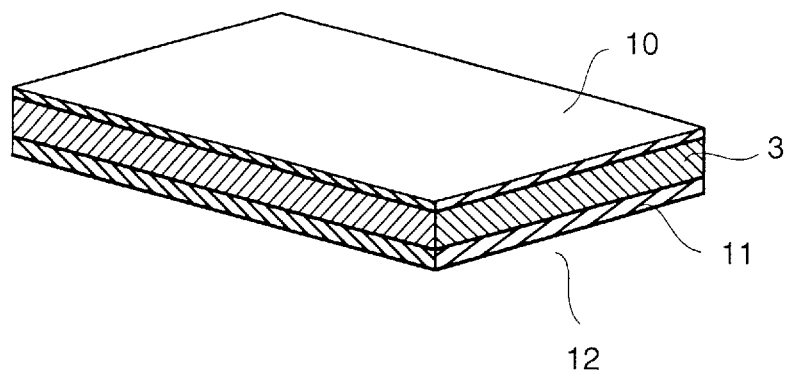
FIG. 3 is a view showing a copper plated laminated plate using an E-glass cloth.
Figure 4:
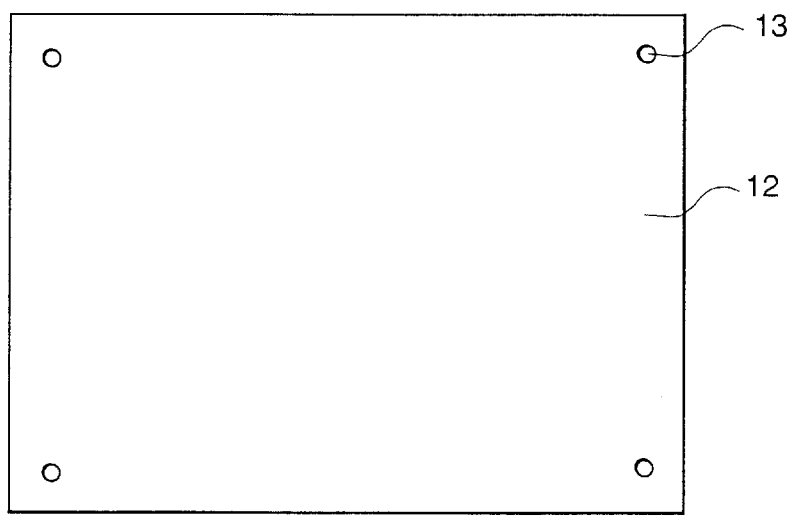
FIG. 4 is a view showing a copper plated laminated plate having guide holes 13 formed in the laminated plate.
Figure 5:
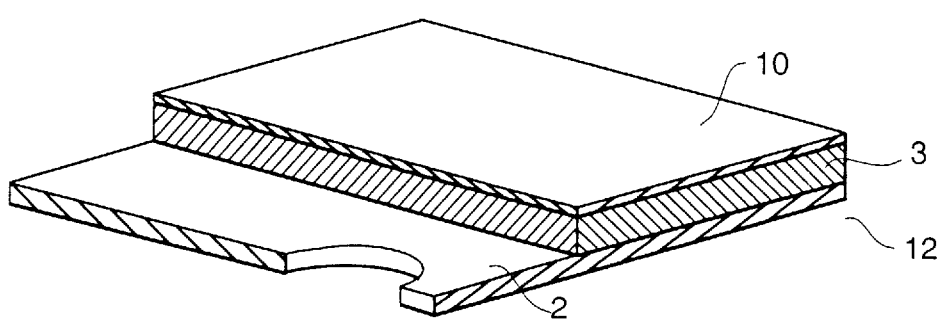
FIG. 5 is a view showing a copper plated laminated plate having an electric power supply wiring conductor formed in the laminated plate.
Figure 6:
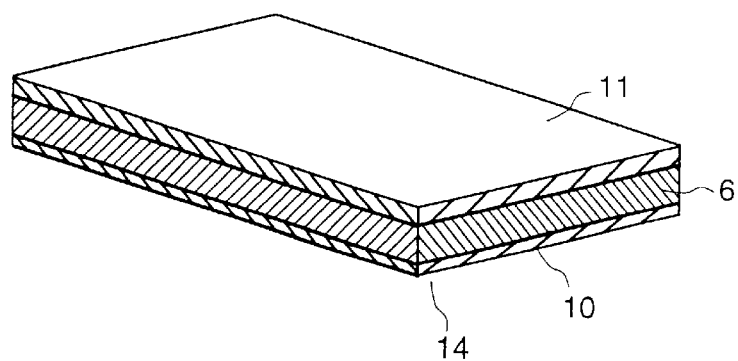
FIG. 6 is a view showing a copper plated laminated plate using a quartz glass cloth.
Figure 7:
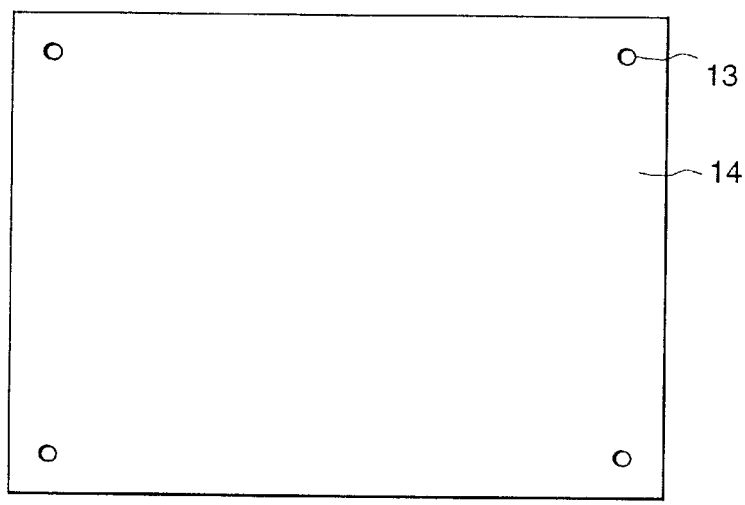
FIG. 7 is a view showing a copper plated laminated plate having guide holes 13 formed in the laminated plate.
Figure 8:
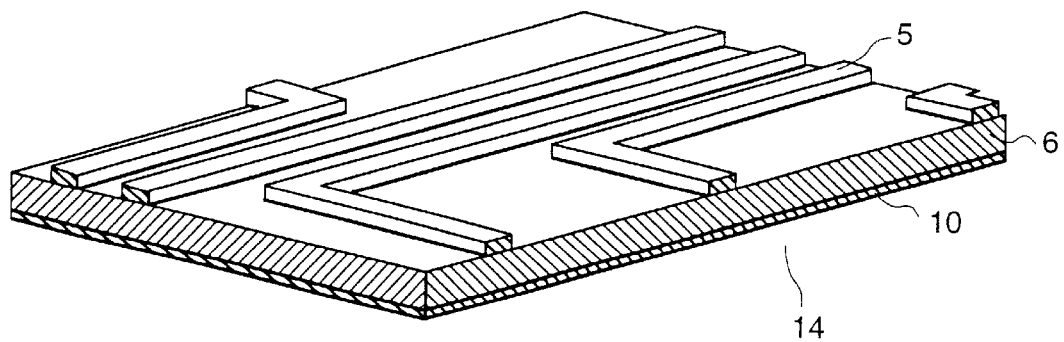
FIG. 8 is a view showing a copper plated laminated plate having a signal wiring conductor formed on the laminated plate.
Figure 9:
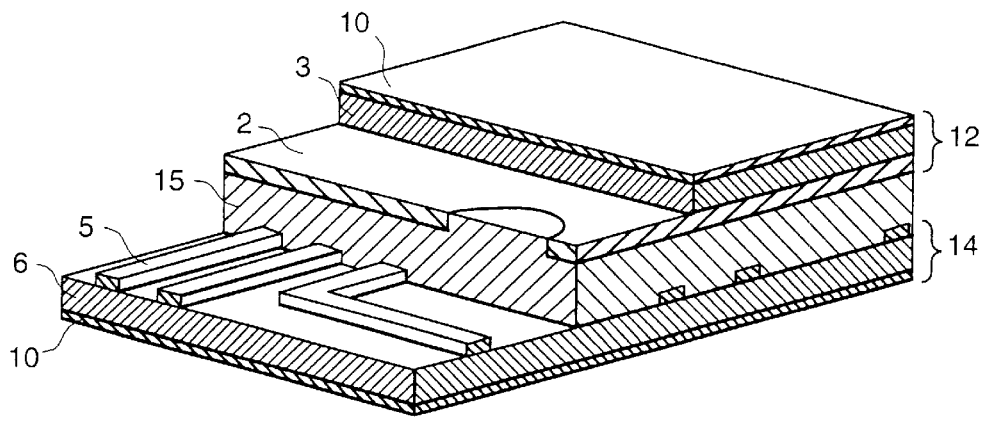
FIG. 9 is a view showing copper plated laminated plates which are laminated through a composite material layer.
Figure 10:
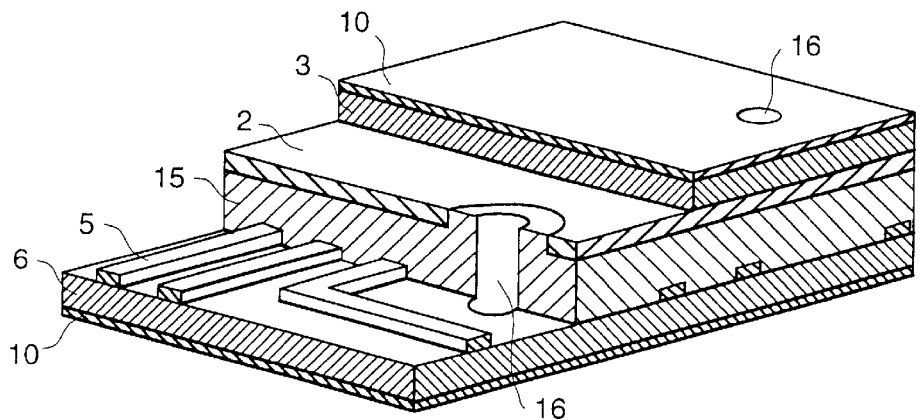
FIG. 10 is a view showing a laminated plate having a through hole bored in the plate.

FIG. 3 is a view showing the copper plated laminated plate 12 which is formed by bonding the copper film 10 and the copper film 11 each onto the both surfaces of the composite material layer 6 using an E-glass cloth; FIG. 4 is a view showing the copper plated laminated plate 12 having guide holes 13 formed in the laminated plate, the holes 13 are used for inserting jigs when the laminated plates are laminated; FIG. 5 is a view showing the copper plated laminated plate having the electric power supply wiring conductor formed on the laminated plate; FIG. 6 is a view showing the copper plated laminated plate 14 which is formed by bonding the copper film 10 and the copper film 11 each onto the both surfaces of the composite material layer 3 using a quartz glass cloth; FIG. 7 is a view showing the copper plated laminated plate 14 having the guide holes 13 formed in the laminated plate, the holes 13 are used for inserting jigs when the laminated plates are laminated; FIG. 8 is a view showing the copper plated laminated plate having the signal wiring conductor 15 formed on the laminated plate; FIG. 9 is a view showing the copper plated laminated plates 12 and 14 which are laminated through the composite material layer 15; FIG. 10 is a view showing the laminated plate having the through hole 16 bored in the plate.

Initially, 100 parts of bisphenol bromide A type epoxy resin (trade name: Epicoat G045, a product of Petrochemical Shell Epoxy Co.) is mixed with 4 parts of dicyan-diamide and 0.15 part of benzyl-dimethylamine, and then dissolved into 70 parts of a mixed solvent of methyl-ethyl ketone, methyl-cellosolve and dimethyl-formamide of 1:1:1. The epoxy resin vanish is applied to quartz glass cloth having a thickness of 0.10 mm which is plane woven with 50 warps/25 mm and 50 woofs/25 mm, and a sheet of prepreg is formed by heating the cloth applied with the vanish at 170° C. for 3 minutes to remove the volatile components such as solvent.

Next, the epoxy resin vanish is applied to E-glass cloth having a thickness of 0.10 mm which is plane woven with 50 warps/25 mm and 50 woofs/25 mm, and a sheet of prepreg is formed by heating the cloth applied with the vanish at 170° C. for 3 minutes to remove the volatile components such as solvent.

Next, as shown in FIG. 3, the sheet of prepreg using the quartz glass cloth is put between the copper film 10 having a weight of ½ ounce per 1 m² and the copper film 11 having a weight of 1 ounce per 1 m², and then they are bonded together by being heated and pressed at a temperature of 170° C. and a pressure of 4 MPa for 1 hour using a press to form the copper plated laminated plate 12 composed of the copper film 10, the copper film 11 and the composite material layer 3 of the quartz glass cloth impregnated with the resin.

Next, as shown in FIG. 4, the guide holes 13 used when the copper plated laminated plates are bonded into a multi-layer are bored in the four corners of the copper plated laminated plate 12.

Then, as shown in FIG. 5, the electric power supply wiring conductor 2 is formed by etching the copper film 11 of the copper plated laminated plate using the quartz glass cloth. The covering ratio of the conductor of the electric power supply wiring 2 is 68%.

On the other hand, as shown in FIG. 6, the sheet of prepreg using the E-glass cloth is put between the copper film 10 having a weight of ½ ounce per 1 m² and the copper film 11 having a weight of 1 ounce per 1 m², and then they are bonded together by being heated and pressed at a temperature of 170° C. and a pressure of 4 MPa for 1 hour using the press to form the copper plated laminated plate 14 composed of the copper film 10, the copper film 11 and the composite material layer 6 of the E-glass cloth impregnated with the resin.

Next, as shown in FIG. 7, the guide holes 13 used when the copper plated laminated plates are bonded into a multi-layer are bored in the four corners of the copper plated laminated plate 14.

Then, as shown in FIG. 8, the signal wiring conductor 5 is formed by etching the copper film 11 of the copper plated laminated plate 14 using the E-glass cloth. The covering ratio of the conductor of the signal wiring is 14%.

Successively, a jig plate made of a stainless steel having positioning pins in 4 corners is prepared, and the guide holes of the copper plated laminated plate 14 are inserted over the pins of the jig plate. At that time, the copper plated laminated plate 14 is put so that the surface on which the signal wiring conductor 5 is formed is oriented upward. Then, guide holes are bored in the sheet of prepreg 15 using the E-glass cloth, and the sheet of prepreg 15 is put on the signal wiring conductor 5.

Next, the guide holes of the copper plated laminated plate 13 are inserted over the pins of the jig plate. At that time, the copper plated laminated plate 13 is put so that the surface on which the electric power supply wiring is formed is oriented downward. Then, the copper plated laminated plates 14 and 12 are bonded through the composite insulator layer 15 together by being heated and pressed at a temperature of 170° C. and a pressure of 2 MPa for 1 hour using the press.

Next, as shown in FIG. 10, the hole 16 for the through hole is bored using a drill, and the copper plating layer 17 having a thickness of 0.03 mm is formed by chemical plating on the inner wall of the hole 16 and on the both surfaces of the copper plated laminated plates 12 and 14. Then, the signal wiring conductor 1 and the signal wiring conductor 4 are formed by etching on the copper film having copper plating formed on it. Next, unnecessary portions in the peripheries of the copper plated laminated plates 12 and 14 are cut off to obtain the multilayer printed wiring board having 4 layers of wiring.

Figure 11:
FIG. 11 is a side view showing a multilayer printed wiring board.

FIG. 11 is a side view showing the multilayer printed wiring board in accordance with the present embodiment. The multilayer printed wiring board was visually observed to be flat as shown in FIG. 11 under temperature of 20° C. From a result of measuring the warpage using a three-dimensional coordinate measuring equipment, the amount of warping per 100 mm was less than 0.1 mm.

Embodiment 2

Figure 12:
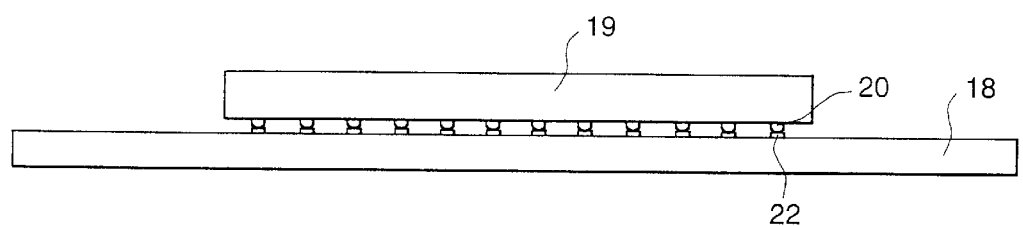
FIG. 12 is a view explaining a second embodiment.

FIG. 12 is a view explaining a second embodiment in accordance with the present invention. Referring to the figure, the reference character 18 is the multilayer printed wiring board formed by Embodiment 1, the reference character 19 is a CSP (chip size package) type LSI element, the reference character 20 is a solder bump, and the reference character 22 is a circuit connecting pad formed on the surface of the multilayer printed wiring board. The CSP type LSI element 19 has 12 connecting terminals spaced 1 mm pitch on a section of 15 mm length. The diameter of the solder bump 20 is 0.3 mm.

When the CSP type LSI element 19 was mounted on the board using the solder bumps 20, the multilayer printed wiring board 18 was heated up to 220° C. The amount of warping occurring that time was less than 0.09 mm per 100 mm. When this amount of warping is converted to the amount of warping per the maximum connecting terminal width of 15 mm of the CSP type LSI element 19, the converted amount of warping becomes less than 0.014 mm. Therefore, the circuit connecting pads 22 formed on the multilayer printed wiring board 18 and the CSP type LSI element 19 can be stably connected as shown in FIG. 12.

Comparative Example 1

Figure 13:
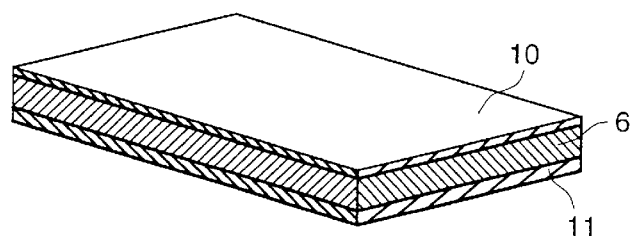
FIG. 13 is a view showing a comparative example 1 of a copper plated laminated plate.
Figure 14:
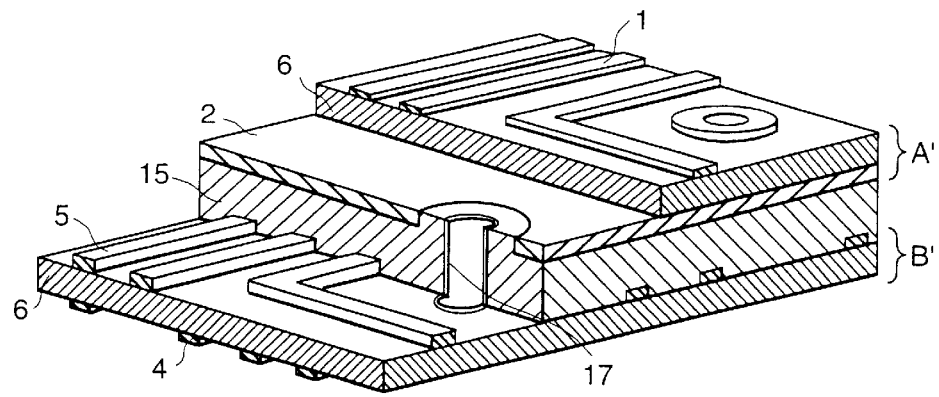
FIG. 14 is a schematic sectional view showing a comparative example 1 of a multilayer printed wiring board.

A comparative example of a multilayer printed wiring board will be described below, referring to FIG. 13 to FIG. 15. FIG. 13 is a view showing a cooper plated laminated plate which is formed by bonding a copper film 10 having a weight of ½ ounce per 1 $m^2$ and a copper film 11 having a weight of 1 ounce per 1 $m^2$ through a composite insulator layer 6 having a thickness of 0.12 mm made of the E-glass cloth; and FIG. 14 is a view showing the comparative example of the multilayer printed wiring board. In FIG. 14, the reference character A' is an upper part body composed of a signal wiring conductor 1 and an electric power supply wiring conductor 2 formed by etching the copper films 10, 11 formed on the composite insulator layer. The parts in the figure equal to the parts shown in FIG. 2 to FIG. 11 are identified by the same reference characters, and the explanation is omitted here.

Referring to FIG. 14, the multilayer printed wiring board is composed of the upper part body A' which is composed of the signal wiring conductor 1 and the electric power supply wiring conductor 2 formed by etching the copper films 10, 11 formed on the composite insulator layer, the lower part body B which is composed of the signal wiring conductor 5 and the signal wiring conductor 4 formed by etching the copper films 10, 11 formed on the composite insulator layer, and the composite insulator 7 bonding the upper part body A' and the lower part body B.

Figure 15:
FIG. 15 is a side view showing the comparative example 1 of the multilayer printed wiring board.

FIG. 15 is a side view showing the comparative example 1 of the multilayer printed wiring board. In the multilayer printed wiring board, the amount of conductor contained in the upper part body A' is more than the amount of conductor contained in the lower part body B. The thermal expansion coefficient of the conductor material of copper film is larger than the thermal expansion coefficient of the composite insulator material composed of the E-glass fiber and the epoxy group resin. Therefore, the thermal expansion coefficient of the upper part body A' is larger than the thermal expansion coefficient of the lower part body B. Accordingly, when the multilayer printed wiring board is cooled, the multilayer printed wiring board is warped so that the upper part body becomes concave because the upper part body is contracted more largely than the lower part body. From a result of measuring the warpage, the amount of warping per 100 mm was 0.51 mm.

Comparative Example 2

Figure 16:
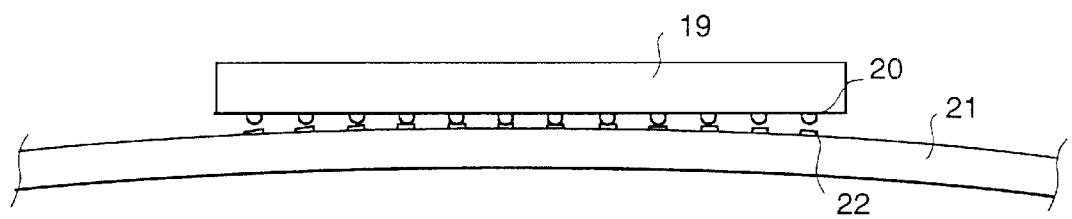
FIG. 16 is a view explaining a comparative example 2.

FIG. 16 is a view explaining a comparative example 2. The reference character 21 is the multilayer printed wiring board fabricated by the comparative example 1. The parts in the figure equal to the parts shown in FIG. 12 are identified by the same reference characters, and the explanation is omitted here.

When the CSP type LSI element 19 was mounted on the board using the solder bumps 21, the multilayer printed wiring board 21 was heated up to 220° C. Because the multilayer printed wiring board 21 was heated up to the temperature higher than the temperature of 170° C. at which the upper part body A' and the lower part body B are bonded together, the multilayer printed wiring board 21 was warped convexly upward as shown in FIG. 16.

The amount of warping occurring that time was 0.56 mm per 100 mm. When this amount of warping is converted to the amount of warping per the maximum connecting terminal width of 15 mm of the CSP type LSI element 19, the converted amount of warping becomes 0.084 mm. Therefore, the circuit connecting pads 22 formed on the multilayer printed wiring board 18 and the terminals of the CSP type LSI element 19 can be connected in the central portion, but can not be connected in the peripheral portion, as shown in FIG. 16.

Embodiment 3

Figure 17:
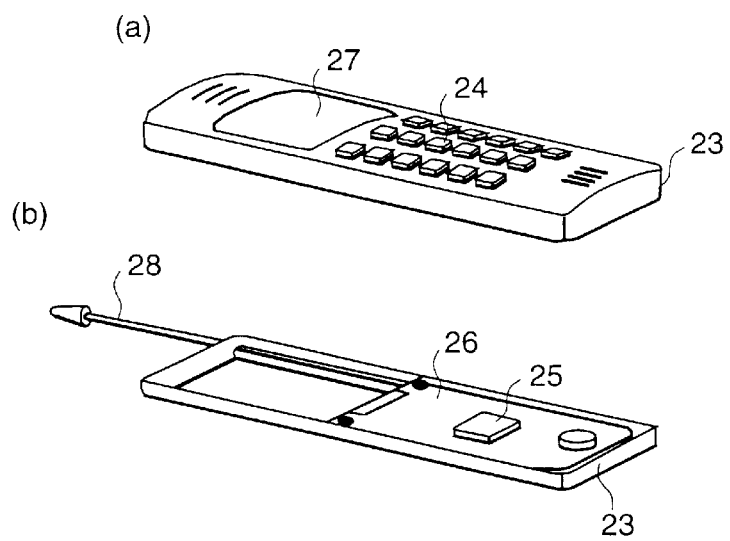
FIG. 17 is a perspective view showing a mounting structure of a cellular phone.

FIG. 17 is a perspective view showing a mounting structure of a cellular phone using a multilayer printed wiring board similar to the multilayer printed wiring borsd fabricated in Embodiment 1 or 2. FIG. 17(a) is a perspective view showing the main body, and (b) is a perspective view showing the inside. The multilayer printed wiring board 26 is contained inside a housing 23 having button keys 24 and so on. The CSP (chip size package) type LSI element 25 was mounted on the surface of the mulatilayer printed wiring board using the solder bumps. The reference character 27 is a liquid crystal display screen, and the reference character 28 is an antenna. A thermal stress test of −40° C. to +125° C. using the board mounting the CSP type LSI element was conducted. As the test result, better connection reliability could be obtained.

Embodiment 4

Poly(P-hydroxy styrene)bromide of 250 g is dissolved into chloroform of 500 g, and added with an aqueous solution of 500 g of 120 g sodium hydroxide while being mixed, and reacts with the sodium hydroxide at 25° C. for 1 hour to form the sodium salt. The mixture is gradually added with 200 g chloroform solution of 120 g chloride methacrylic acid and reacts with the chloride methacrylic acid at 25° C. for 2 hours, and then the chloroform solution is separated from the aqueous solution and condensed to obtain the reactant. Further, purification is performed by dissolving the reactant with acetone and dropping the solution into methanol.

The poly(P-hydroxy styrene)bromide methacrylate obtained as described above was dissolved into methyl ketone to obtain a vanish having a solid composition of 40 to 50 weight %. Further, 3 parts of digmil-peroxide was added to 100 parts of the resin as a radical polymerizing starter. Then, the vanish was impregnated into E-glass cloth (50 $\mu$m thickness) and quartz glass cloth (50 $\mu$m thickness) each, and dried at 60 to 80° C. for 10 to 20 minutes to obtain two kinds of tuck-free prepreg. Next, the two prepreg sheets for each kind were put together, and copper films (35 $\mu$m thickness) each having a roughened surface in the prepreg side were laminated on the both surfaces of the prepreg sheet put together, and the prepreg sheet with the copper films was pressed and heated by a pressure of 30 kgf/$cm^2$ and at a temperature of 130° C. for 30 minutes, and then further pressed at a temperature of 170° C. for 1 hour to obtain a copper plated laminated plate. The thickness of this laminated plate was approximately 100 $\mu$m. An inner layer wiring pattern of a signal layer having a covering ratio of 15% was formed on the obtained copper plated laminated plate using the E-glass cloth through the photo-etching method, and an inner layer wiring pattern of an electric power supply layer having a covering ratio of 70% was formed on the obtained copper plated laminated plate using the quartz glass cloth, and then the copper surfaces of the wiring patterns were processed through the following method to form both-surface wiring unit circuit sheets. Therein, the electric power supply layers were formed on the both surfaces of the insulator layer.

Trichloro-ethylene washing→{copper chloride/chloride solution (1) immersing (40 to 50° C., 2 minutes)}→water washing→{10% sulfuric acid immersing (room temperature, 2 minutes)}→water washing→air blow→{oxide film forming solution (2) immersing (70 to 80° C., 2 minutes)}→water washing→{drying (100° C., 30 minutes)} composition of the solution:

(1) concentrated hydrochloric acid 300 g, cupric chloride 50 g, distilled water 650 g (roughening copper surface)

(2) sodium hydroxide 5 g, trisodium phosphate 10 g, sodium chlorite 30 g, distilled water 955 g (stabilizing copper surface)

After completion of the above-mentioned processing, 30 layers of signal wiring conductor layers and 2 layers of electric power supply layers were formed using the prepreg resin sheets, and bonded at temperature of 170° C. and with a pressing pressure of 20 kgf/cm$^2$ for 8 hours to form a multilayer printed wiring board. Three-ply prepreg resin sheets was used for bonding to form multilayer. The thickness was approximately 150 μm.

The bonding to form multilayer was performed through the method of inserting guide pins into holes provided in the four corners of the sheet in order to prevent the positional displacement. After completion of bonding to form multilayer, a hole having a diameter of 0.3 mm or 0.6 mm was bored using a microdrill, and the whole surface was chemically plated with copper to form a through hole conductor. Then, the outermost layer wiring was formed by etching to fabricate the multilayer printed wiring board.

The present embodiment could fabricate the multilayer printed wiring board which had a size of approximately 4 mm thickness×570 mm×420 mm, two kinds of line widths of 70 μm and 100 μm, (channels/grid) of 2 to 3 lines/1.3 mm, and displacement between layers less than approximately 100 μm. The volume of the glass cloth was approximately 30 volume % of the insulator layers.

The multilayer printed wiring board of the present embodiment is effective as a printed board for a large-scale computer.

As having been described above, according to the present invention, since the thermal expansion coefficients of the composite insulator layers are adjusted, it is possible to suppress warping of the multilayer printed wiring board due to temperature change even if the thicknesses and the covering ratios on the both sides of the electric conductor layer are asymmetric with respect to the central plane.

By using the multilayer printed wiring board of which the warping due to temperature change is suppressed, the electronic part can be stably mounted on the board and accordingly a highly reliable electronic device can be obtained.

What is claimed is:

1. A multilayer printed wiring board formed by laminating composite insulation layers and laminated bodies, said composite insulation layers being made of a cloth with a resin impregnated into said cloth, each of said laminated bodies being composed of electric conductor layers formed on at least one surface of a composite insulation layer, wherein a thermal expansion coefficient of a composite insulation layer of one of said laminated bodies, having an electric conductor layer with a higher covering ratio, is set to a value smaller than a thermal expansion coefficient of a composite insulation layer of another of the laminated bodies, having an electric conductor layer with a lower covering ratio.

2. A multilayer printed wiring board formed by laminating composite insulation layers and laminated bodies, said composite insulation layers being made of a cloth with a resin impregnated into said cloth, each of said laminated bodies being composed of electric conductor layers formed on at least one surface of a composite insulation layer, wherein a thermal expansion coefficient of the cloth in a composite insulation layer of one of the laminated bodies, having an electric conductor layer with a higher covering ratio, is smaller than a thermal expansion coefficient of the cloth in a composite insulation layer of another of the laminated bodies, having an electric conductor layer with a lower covering ratio.

3. A multilayer printed wiring board formed by laminating composite insulation layers and laminated bodies, said composite insulation layers being made of a cloth with a resin impregnated into said cloth, each of said laminated bodies being composed of electric conductor layers formed on at least one surface of a composite insulation layer, wherein said electric conductor layers include at least one electric power supply layer and at least one signal layer, and a thermal expansion coefficient of at least one of said composite insulation layers of one of the laminated bodies, in contact with said electric power supply layer, is set to a value smaller than a thermal expansion coefficient of a composite insulation layer of another of the laminated bodies, in contact with said signal layer.

4. A multilayer printed wiring board formed by laminating composite insulation layers and laminated bodies, said composite insulation layers being made of a cloth with a resin impregnated into said cloth, each of said laminated bodies being composed of electric conductor layers formed on at least one surface of a composite insulation layer, wherein said electric conductor layers include an electric power supply layer having a covering ratio of 60 to 80% and a signal layer having a covering ratio of 10 to 20%, and a thermal expansion coefficient of at least one of said composite insulation layers of one of the laminated bodies, in contact with said electric power supply layer, is within a range of $8.5 \times 10^{-6}$/°C. to $9.5 \times 10^{-6}$/°C., and a thermal expansion coefficient of at least one of said composite insulation layers of another of the laminated bodies, in contact with said signal layer, is within a range of $10 \times 10^{-6}$/°C. to $12 \times 10^{-6}$/°C.

5. A multilayer printed wiring board formed by laminating composite insulation layers and laminated bodies, said composite insulation layers being made of a cloth with a resin impregnated into said cloth, each of said laminated bodies being composed of electric conductor layers formed on at least one surface of a composite insulation layer, wherein a thermal expansion coefficient of one of said composite insulation layers, of one of the laminated bodies composed of an electric conductor layer having a covering ratio of 60 to 80%, is within a range of $8.5 \times 10^{-6}$/°C. to $9.5 \times 10^{-6}$/°C., and a thermal expansion coefficient of another of said composite insulation layers, of another of the laminated bodies composed of an electric conductor layer having a covering ratio of 10 to 20%, is within a range of $10 \times 10^{-6}$/°C. to $12 \times 10^{-6}$/°C.

6. A multilayer printed wiring board formed by laminating composite insulation layers and laminated bodies, said composite insulation layers being made of a cloth with a resin impregnated into said cloth, each of said laminated bodies being composed of electric conductor layers formed on at least one surface of a composite insulation layer, wherein said electric conductor layers include an electric power supply layer and a signal layer, and said cloth of at least one of said composite insulation layers of one of the laminated bodies, in contact with said electric power supply layer, is made of quartz glass, and said cloth of a composite insulation layer of another of the laminated bodies, in contact with said signal layer, is made of glass having a thermal expansion coefficient larger than a thermal expansion coefficient of said quartz glass.

7. An electronic equipment comprising a multilayer printed wiring board formed by laminating composite insulation layers and laminated bodies, said composite insulation layers being made of a cloth with a resin impregnated into said cloth, said laminated body being composed of electric conductor layers formed on a surface of a composite insulation layer; and electronic parts mounted on a circuit connecting pad formed on a surface of said multilayer printed wiring board, wherein said multilayer printed wiring board is any one of the multilayer printed wiring boards according to claims 1 to 6.

8. A multilayer printed wiring board according to claim 4, wherein said electric power supply layer has a covering ratio of 65 to 75%, and wherein said thermal expansion coefficient of said composite insulation layer in contact with the signal layer is $10.5 \times 10^{-6}/°C.$ to $11.5 \times 10^{-6}/°C.$

* * * * *